United States Patent
Heroux et al.

(10) Patent No.: US 11,943,865 B2
(45) Date of Patent: Mar. 26, 2024

(54) TRANSPARENT CONDUCTIVE CIRCUIT

(71) Applicant: Chasm Advanced Materials, Inc., Canton, MA (US)

(72) Inventors: Richard P. Heroux, Seekonk, MA (US); Timothy Alan Turner, Pelham, NH (US); David Joseph Arthur, Norwood, MA (US); Sean Patrick Arthur, Boston, MA (US)

(73) Assignee: Chasm Advanced Materials, Inc., Canton, MA (US)

( * ) Notice: Subject to any disclaimer, the term of this patent is extended or adjusted under 35 U.S.C. 154(b) by 459 days.

(21) Appl. No.: 17/424,935

(22) PCT Filed: Nov. 13, 2019

(86) PCT No.: PCT/US2019/061231
§ 371 (c)(1),
(2) Date: Jul. 22, 2021

(87) PCT Pub. No.: WO2020/102392
PCT Pub. Date: May 22, 2020

(65) Prior Publication Data
US 2022/0095452 A1  Mar. 24, 2022

Related U.S. Application Data

(60) Provisional application No. 62/760,376, filed on Nov. 13, 2018.

(51) Int. Cl.
*B41C 1/14* (2006.01)
*C23F 1/40* (2006.01)
(Continued)

(52) U.S. Cl.
CPC ............... *H05K 1/092* (2013.01); *B41C 1/14* (2013.01); *C23F 1/40* (2013.01); *H01B 1/24* (2013.01); *H05K 3/067* (2013.01)

(58) Field of Classification Search
CPC .. B41C 1/14; C08K 3/041; C08K 3/08; C08L 33/04; C23F 1/40; H01B 1/24; H01B 1/026; H01B 1/22; H05K 1/0274; H05K 1/092; H05K 1/095; H05K 1/09; H05K 2201/0108; H05K 2201/026; H05K 2201/0323; H05K 2201/0347; H05K 2201/09681;
(Continued)

(56) References Cited

U.S. PATENT DOCUMENTS

| | | | |
|---|---|---|---|
| 2013/0284244 A1* | 10/2013 | Kato | C08J 7/044 156/60 |
| 2014/0021400 A1* | 1/2014 | Coenjarts | C03C 15/00 252/79.4 |

(Continued)

FOREIGN PATENT DOCUMENTS

WO  WO-2016172315 A1 * 10/2016  ............. B32B 15/02

*Primary Examiner* — Timothy J Thompson
*Assistant Examiner* — Guillermo J Egoavil
(74) *Attorney, Agent, or Firm* — Prince Lobel Tye LLP

(57) ABSTRACT

A transparent conductive film (TCF) and methods for creating the TCF. The TCF includes a substrate having a surface, a metal mesh layer over at least a portion of the surface of the substrate, and a conductive layer over the metal mesh layer. The conductive layer includes carbon nanotubes and a binder.

23 Claims, 5 Drawing Sheets

(51) Int. Cl.
    *H01B 1/24*           (2006.01)
    *H05K 1/09*           (2006.01)
    *H05K 3/06*           (2006.01)

(58) Field of Classification Search
    CPC .......... H05K 3/06; H05K 3/067; H05K 3/246; H05K 9/009; H05K 9/0094; H05K 1/097; B32B 15/02; B32B 15/08; B32B 15/20; B32B 27/20; B32B 5/02; B32B 2305/10; B32B 2305/30; B32B 2307/202; B32B 2307/40; B32B 2311/08; B32B 2311/12; B32B 2313/04; B32B 2457/00; B32B 2551/00; B82Y 10/00; C09D 5/24; C09D 7/61; C09D 11/52
    USPC .......................................... 174/255; 428/209
    See application file for complete search history.

(56) References Cited

U.S. PATENT DOCUMENTS

2019/0270293 A1\*   9/2019   Varjos ..................... B32B 27/32
2021/0016349 A1\*   1/2021   Xiong ..................... B22F 3/002

\* cited by examiner

TRANSPARENT CONDUCTIVE CIRCUIT

BACKGROUND

This disclosure relates to a transparent conductive circuit.

Carbon nanotube (CNT) hybrid transparent conductive films (TCF) have applications in electronic devices. Some such TCF comprise a silver nanowire (AgNW) layer and a printed CNT ink layer. A wet wiping method can be used to remove the exposed AgNW regions (i.e., the regions where the CNT ink is not printed).

SUMMARY

This disclosure relates to CNT-based hybrid TCF comprising a metal mesh (MM) layer and a printed CNT ink layer. A circuit pattern results after the exposed MM (i.e., the regions where the CNT ink is not printed) is removed via chemical etching.

A benefit of using MM vs. AgNW is that lower sheet resistance values can be realized for the transparent CNT hybrid transparent circuit, while maintaining high transparency. Low sheet resistance (Rs) is important for certain applications, especially antennas. It is believed that Rs≤1 Ohm per square (OPS) is needed for printed transparent antennas to perform like printed opaque metal antennas. High transparency is also desired, with 85% visible light transmittance (VLT) for the printed transparent conductive film (excluding the substrate) generally considered a minimum target. More preferably, the VLT should be ≥90%.

A benefit of using chemical etchant to dissolve the exposed MM regions is that it may not be practical to use wet wiping to remove the MM. For chemical etching to work the printed CNT ink should also act as an etch mask. This makes the CNT ink a multifunctional material. Not only does the CNT ink allow for the creation of a CNT hybrid (either CNT+MM or CNT+AgNW, with polymer binder used in both cases) transparent conductive film that is better than CNT or MM or AgNW alone, but the CNT ink also enables standard flexible printed circuit processing methodology to be used (i.e., use a chemical etchant to dissolve the conductive regions not covered by the etch mask).

Also, it can be beneficial to use chemical etchant for creating circuits comprising a AgNW layer with CNT ink printed on top. The wet wiping process is not as universally accepted by the flexible printed circuit industry, which typically uses chemical etchants that are typically sprayed on or dipped into. The wet wiping process has the potential of leaving residual AgNW on top of the circuit pattern, which could create a potential long-term reliability issue. Furthermore, the wet wiping process requires some amount of force for the wiping to be effective, which can damage finer circuit traces, e.g., those that are 100 microns or so in width. Also, it is easier to etch a fine gap (100 microns or less) than use wet wiping; the etching method is more likely to remove 100% of the AgNWs from the gap area, preventing risk of having crosstalk between adjacent circuit features.

All examples and features mentioned below can be combined in any technically possible way.

In one aspect a transparent conductive film (TCF) includes a substrate having a surface, a metal mesh layer over at least a portion of the surface of the substrate, and a conductive layer over the metal mesh layer, the conductive layer comprising carbon nanotubes (CNT) and a binder.

Some examples include one of the above and/or below features, or any combination thereof. The TCF may further comprise a second metal layer between the metal mesh layer and the conductive layer. The second metal layer may comprise a copper layer. The copper layer may be electroplated on the metal mesh layer. The TCF may have a sheet resistance of no more than 1 Ohm per square (OPS).

Some examples include one of the above and/or below features, or any combination thereof. The metal mesh layer and the conductive layer in combination may have a visible light transmittance (VLT) of at least 85%. The metal mesh layer and the conductive layer in combination may have a VLT of at least 90%. The metal mesh layer may comprise a network of interconnected metal traces with open spaces between the traces. The network may be in a diamond, hexagonal, rectangular or random pattern. The metal mesh layer may comprise at least 90% open spaces. The metal traces may have a line width of no more than 30 microns. The open spaces of the metal mesh layer may have a width that is at least fifteen times the width of the metal traces. The TCF may define a circuit with conductive lines having a width, wherein the conductive line width is at least ten times the width of the metal mesh open spaces. The metal mesh may comprise two different metals, a second metal on top of a first metal. The first metal may comprise silver and the second metal may comprise copper.

Some examples include one of the above and/or below features, or any combination thereof. The CNT in the conductive layer may comprise a network with an areal density of about 1-10 mg/m2. The ratio of binder:CNT in the conductive layer can be greater than 120:1.

In another aspect a method of producing a TCF includes providing a substrate having a surface, depositing a metal mesh layer or a nanowire layer over at least a portion of the surface of the substrate, and patterning a conductive layer over at least some of the metal mesh layer or the nanowire layer, the conductive layer comprising carbon nanotubes (CNT) and a binder.

Some examples include one of the above and/or below features, or any combination thereof. The method may further comprise depositing a second metal layer on the metal mesh layer, before patterning the conductive layer. The method may further comprise etching exposed metal mesh layer or nanowire layer that is not covered by the conductive layer. The etching may be accomplished by spraying an etchant onto the TCF. The etchant may comprise ferric nitrate.

DETAILED DESCRIPTION

Figure 1:
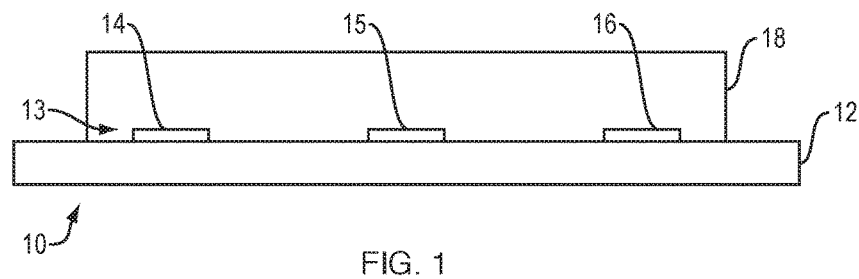
FIG. 1 is a schematic side view of a TCF.

A CNT-based hybrid TCF 10, FIG. 1, comprises a MM layer 13 that includes metal traces 14-16, and an overlying CNT ink layer 18 that bonds to the top surface of substrate 12 and encapsulates MM layer 13 with a conductive medium. A circuit pattern results after any exposed MM (i.e., the regions where the CNT ink is not printed) is removed via chemical etching.

Figure 4A:
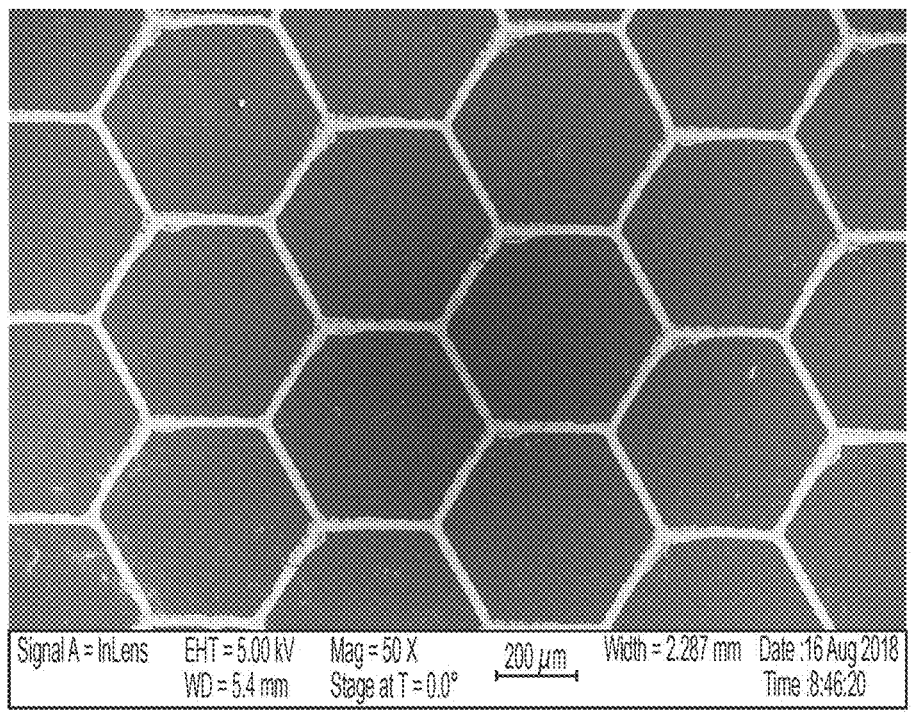
FIGS. 4A-4C are three images of a TCF at different magnifications.
Figure 4B:
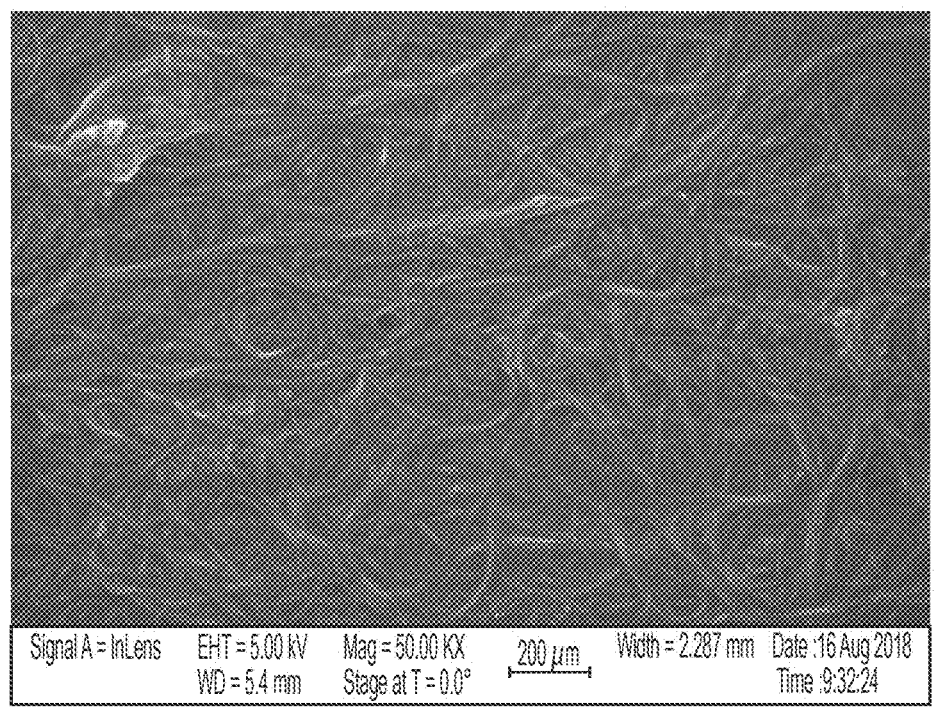
Figure 4C:
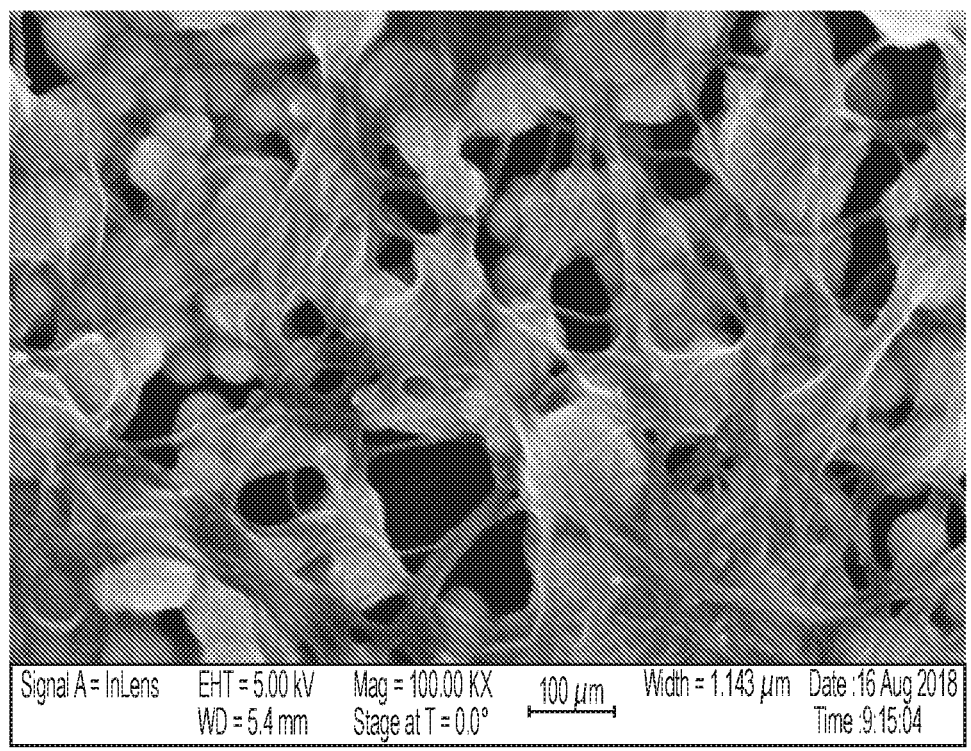

FIGS. 2A-2D illustrate results of a process for creating a TCF of the present disclosure. Note that the dimensions and other aspects of FIGS. 2A-2D are not to scale and may be exaggerated, for the sake of illustration only. Actual examples are set forth below. Assembly 20, FIG. 2A, comprises substrate 22 that carries a MM comprising traces 24-27. The MM can be created on the substrate by various means as described herein. Also the MM can comprise various conductive materials (e.g., metals), as further described herein. The MM comprises a series of thin traces (lines) that are electrically connected. The traces are typically but not necessarily laid out in a regular pattern (such as the hexagonal pattern illustrated in FIG. 4A).

Figure 2A:
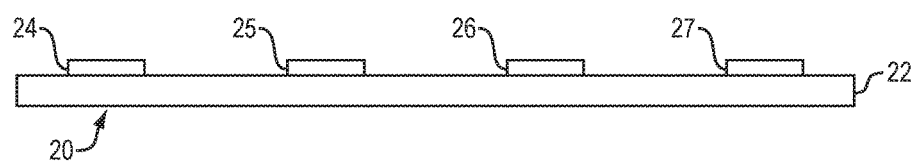
FIGS. 2A-2D illustrate a method of creating a TCF.
Figure 2B:
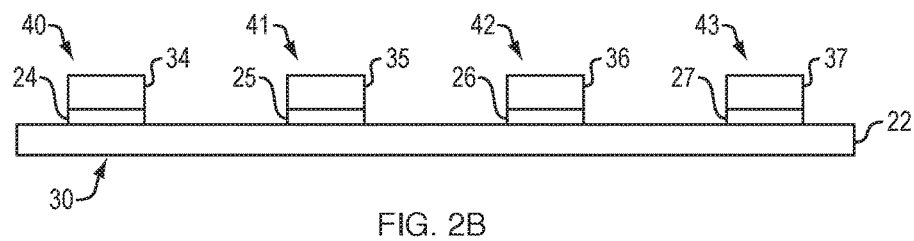

FIG. 2B illustrate a further assembly 30 wherein the MM is over-plated with a second metal (in this non-limiting example the second metal being copper). Thus traces 24-27 are covered by a generally thicker layer of a second metal comprising portions 34-37, to create thickened and less-porous MM traces 40-43, respectively.

Figure 2C:
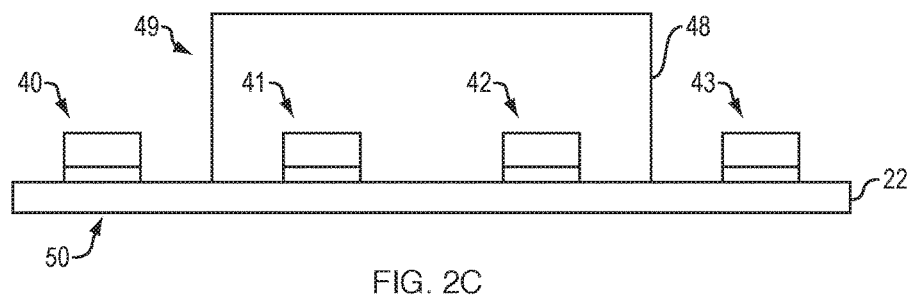

FIG. 2C illustrates a further assembly 50 wherein CNT ink 48 is printed or otherwise placed over some or all of the MM layer illustrated in FIG. 2B. In this illustration ink 48 is printed over traces 41 and 42 but not over traces 40 and 43. Traces 40 and 43 are thus exposed while traces 41 and 42 are covered by a conductive medium that creates a conductive line or conductive area 49.

Figure 2D:
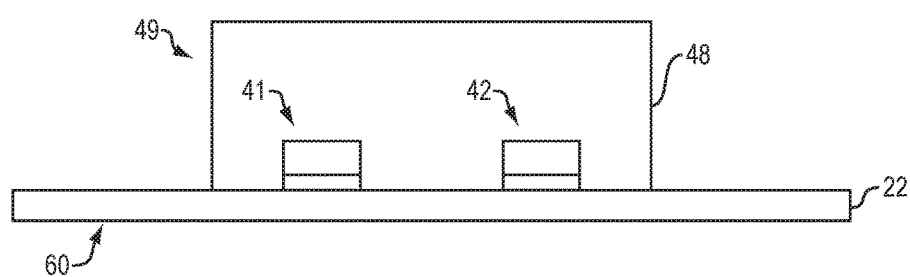

FIG. 2D illustrates the final TCF 60 wherein exposed traces 40 and 43 have been removed by etching, as explained in more detail elsewhere herein. This leaves conductor 49 on substrate 22.

Figure 3:
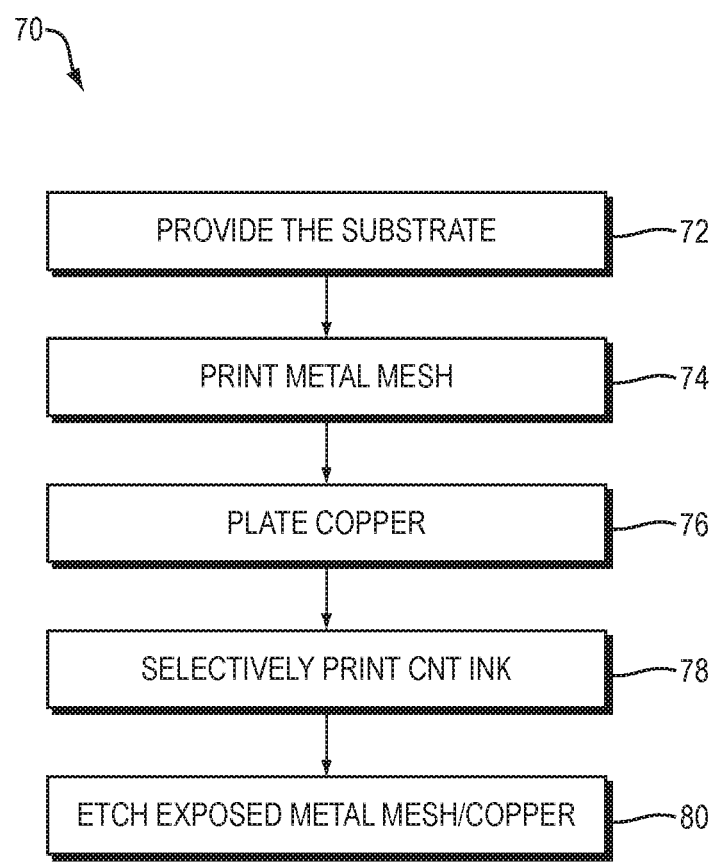
FIG. 3 illustrates the steps of a process for creating a TCF.

One exemplary method 70 for producing a TCF is illustrated in FIG. 3. In step 72 a suitable substrate is provided. In step 74 a metal mesh is printed on a surface of the substrate. In step 76 a second metal (e.g., copper) is plated on the metal mesh. Step 76 is optional, as if the MM itself has an acceptable Rs the thickness (i.e., the height) of the MM lines may not need to be increased. The added plated metal increases the volume of the MM traces and so decreases its resistance. Also it may help to make the thin MM more robust and better able to bond with the conductive ink. In step 78 a conductive medium (termed an "ink") is printed in selected areas of the MM to form parts of a circuit. In an example the ink comprises carbon nanotubes as its conductive medium, and also contains a binder. CNT inks are further described elsewhere herein. The final step 80 contemplates etching exposed MM/copper, to leave behind on the substrate only the circuit.

The disclosure is elaborated in more detail in the several non-limiting examples set forth below. The examples illustrate aspects of the TCF and its manufacture. Parameters of the TCF and methods of producing the TCF include the following.

Metal meshes may be considered to be metallic grids composed of ultra-narrow lines that provide electrical conductivity via the interconnected lines while also allowing for VLT via the spaces between the lines. Metal meshes can be created on a surface of the substrate by any viable method, including but not limited to direct printing, embossing, photo patterning followed by etching, and printing followed by plating. The metal mesh can be created in a width that is sufficient for the ultimate application of the TCF. Widths can be up to 12 inches, 24 inches, or more.

The width of the metallic lines comprising the MM will depend on the method by which the MM was made (some methods are capable of making finer line widths) and also the requirements of the application (some applications, like touch screens, require line widths to be small enough that they are not visible to the naked eye). Coarser MM will typically have line widths of about 25 to 50 µm. Finer MM will typically have line widths of about 2 to 10 µm. For the line widths to be relatively invisible, they need to be less than about 6 µm.

The spacing between the metallic lines depends on the desired visible light transmittance (VLT), the metal line width and the metallic grid pattern (e.g., hexagonal, rectangular, random, etc.). The metal lines are thick enough to essentially have negligible VLT (i.e., the metal lines either absorb or reflect almost all of the light). Thus the VLT for the MM is defined mainly by the percent open area of the metallic grid pattern. The spacing between the metallic lines can be computed for the various geometries of the metallic grid pattern for a given metallic line width and VLT target. For coarser MM with line width of 30 µm and percent open area of 90%, the spacing between metallic lines is about 550 µm for both hexagonal and square grid patterns. For finer MM with line width of 5 µm and percent open area of 90%, the spacing between metallic lines is about 91 µm for both hexagonal and square grid patterns.

Table 1 illustrates calculations of spacing for various combinations of percent open area and metal line width. These are illustrative, not limiting or defining.

TABLE 1

| Open Area (%) | 85 | 90 | 95 | 85 | 90 | 95 | 85 | 90 | 95 | 85 | 90 | 95 | 85 | 90 | 95 |
|---|---|---|---|---|---|---|---|---|---|---|---|---|---|---|---|
| Line Width (µm) | 2 | 2 | 2 | 5 | 5 | 5 | 10 | 10 | 10 | 25 | 25 | 25 | 50 | 50 | 50 |
| Spacing (µm) | 24 | 37 | 77 | 59 | 92 | 190 | 119 | 184 | 380 | 297 | 459 | 593 | 593 | 919 | 1,902 |

The required metal thickness is dependent on the volume resistivity of the metal, the percent open area and the target sheet resistance for the MM.

For a MM with metal volume resistivity of 4 µΩ-cm (typical value for flexo printed nano-silver ink) and metal grid thickness of 0.15 µm and open area of 90%, the resulting sheet resistance for the MM is 6 Ω/□. For the sheet resistance of the MM to be 1 Ω/□ or less (which has been found to be strongly desired for antenna and RF shielding applications), then the thickness for this metal grid would need to be 0.9 µm or higher. For metal grids with open area of 85%, the required metal grid thickness to achieve sheet resistance ≤1 Ω/□ is 0.6 µm or greater. For metal grids with open area of 95%, the required metal grid thickness to achieve sheet resistance ≤1 Ω/□ is 1.8 µm or greater.

The literature value for the volume resistivity of copper is 1.72 µΩ-cm and for silver is 1.59 µΩ-cm. These are both lower than typical values achieved for electroplated copper and flexo printed nano-silver due to porosity in the plated or printed lines. But, if one were to achieve the copper literature value for volume resistivity for the fabricated metal grid, then the required metal grid thickness to achieve sheet resistance ≤1 Ω/□ is 0.4 µm or greater.

Commercial methods for making the metal grid include direct printing, embossing, photo-patterning followed by etching, etc. Most commercial methods for making MM are not able to achieve sufficient metal thickness to result in a sheet resistance of ≤1 Ω/□ for metal grids with open areas in the range of 85-95%. The thickness of metal grids can be built up by electroplating or by any other viable process.

To achieve such low sheet resistance for MM with such high % open area, a very low volume resistivity is required for the material comprising the grid, which makes metals the only practical material. Table 2 illustrates the volume resistivities for various materials in units of Ω-m. To convert these values to µΩ-cm, then one must multiply by $10^8$.

TABLE 2

ELECTRICAL RESISTIVITY FOR COMMON MATERIALS

| MATERIAL | ELECTRICAL RESISTIVITY AT 20° C. OHM METRES |
|---|---|
| Aluminum | $2.8 \times 10^{-8}$ |
| Antimony | $3.9 \times 10^{-7}$ |
| Bismuth | $1.3 \times 10^{-6}$ |
| Brass | $\sim 0.6\text{-}0.9 \times 10^{-7}$ |
| Cadmium | $6 \times 10^{-8}$ |
| Cobalt | $5.6 \times 10^{-8}$ |
| Copper | $1.7 \times 10^{-8}$ |
| Gold | $2.4 \times 10^{-8}$ |
| Carbon (Graphite) | $1 \times 10^{-5}$ |
| Germanium | $4.6 \times 10^{-1}$ |
| Iron | $1.0 \times 10^{-7}$ |
| Lead | $1.9 \times 10^{-7}$ |
| Manganin | $4.2 \times 10^{-7}$ |
| Nichrome | $1.1 \times 10^{-6}$ |
| Nickel | $7 \times 10^{-8}$ |
| Palladium | $1.0 \times 10^{-7}$ |
| Platinum | $0.98 \times 10^{-7}$ |
| Quartz | $7 \times 10^{17}$ |
| Silicon | $6.4 \times 10^{2}$ |
| Silver | $1.6 \times 10^{-8}$ |
| Tantalum | $1.3 \times 10^{-7}$ |
| Tin | $1.1 \times 10^{-7}$ |
| Tungsten | $4.9 \times 10^{-8}$ |
| Zinc | $5.5 \times 10^{-8}$ |

Some of the metals have volume resistivity less than about 10 µΩ-cm. Higher volume resistivity has significant consequences, as it increases the required metal thickness to achieve sheet resistance ≤1 Ω/□. This increases the cost of making the MM and also increases the cost of etching the MM when circuits are patterned. An estimation is that metals with literature values for volume resistivity that are more than two times that of copper will not be so practical. If this selection criterion is applied to the above table, the only metals that would be selected are copper, silver, aluminum and gold. Interestingly, these are all metals that are commonly used in manufacturing printed circuits.

Another selection criterion is the ability to etch the MM with a commercially viable etchant. Although it is technically possible to etch gold with aqua regia, it is not commercially practical. Silver is typically etched with ferric nitrate. Copper is typically etched with ferric chloride, but it can also be etched with ferric nitrate (the same etchant used for silver). Aluminum is typically etched with sodium hydroxide or potassium hydroxide. Thus it appears that silver, copper and aluminum are all commercially viable MM compositions, from an etch standpoint. It has been found that the CNT ink formulations that are used in the examples are also suitable as an etch mask material for all of the typical etchants used for silver, copper and aluminum. It is also useful to note that MM made by printing nano-silver ink followed by electroplating copper was successfully etched with a single etchant, ferric nitrate. This makes the manufacturing process more cost efficient than requiring two separate etching processes.

As to the CNT ink formulation, the polymer binder type must be soluble in the ink vehicle (ideally, it should be soluble in alcohol), must have good adhesion to the substrate, must have high VLT and low haze and be as colorless as possible, must be able to encapsulate the CNTs and also the MM and must be chemically resistant to the etchants that may be used for etching the MM (i.e., it must enable the CNT ink to act as an etch mask). The ability of the CNT ink to perform as an etch mask is also dependent on the ratio of binder to CNT in the CNT ink. Too little binder can result in the CNT ink not being suitable as an etch mask—it does not sufficiently protect the underlying MM when the exposed MM regions (regions not covered by CNT ink) are being etched. Too much binder can compromise the ability of the CNTs to make good electrical connectivity with each other and/or with the underlying MM and/or the surface of the circuit (for achieving low contact resistance with printed interconnects).

It has been found that CNT inks made using similar ink vehicle chemistry as in the international patent application incorporated by reference herein, with CNT concentration of 0.1 g/L, acrylic copolymer binder (DSM B890) and printed at 30 mg/m² ink coverage performed well as an etch mask when binder:CNT ratio was 240:1. Ratios of 60:1 and 120:1 were completely unacceptable (i.e., the underlying MM was etched). A ratio of 180:1 was marginal (sometimes was ok, but not always). It was also found that 240:1 did not seem to compromise the electrical connectivity of the CNTs. It is believed that ratios higher than 240:1 would be acceptable, and that the upper limit would be the percolation threshold for the CNTs in this binder system, which is estimated to be approximately 0.2 wt % CNTs. This would correspond to a binder:CNT ratio of about 400:1.

Following are several examples that illustrate aspects of this disclosure.

≤1 OPS AgNW Version Compared to MM Version.

<1 OPS AgNW version: A TCF was prepared using polyethylene terephthalate (PET) (125 um) as the substrate, coated with a dispersion of 2.0% by weight silver nanowire (AgNW) in isopropyl alcohol (IPA) using ~40 nm diameter, 15 um length AgNW. The AgNW coating was ~5 inches wide×7 inches long. The AgNW dispersion was coated onto the PET film using a Mayer rod (40 micron wet-film-thickness) at 632 mg/m2 AgNW coverage. The coating was dried with a hand-held convection dryer set to 177° C. exit air temperature for ~30 seconds and then baked in a convection oven for 3 minutes at 105° C. After the AgNW coating, the % visible light transmission (% VLT) was 45.6% (subtracting the substrate VLT), and the assembly had a sheet resistance (Rs) of 1 Ω/□. The AgNW coating was screen-printed with a carbon nanotube ink (using a reformulated version of VC101 single wall CNT ink from Chasm Advanced Materials Inc., Canton, MA, US) using a 305 polyester mesh screen (~30 um wet-film thickness) having a 2.5 inch block pattern. The ink was reformulated to a CNT concentration of 0.1 g/L and included a polymer binder (e.g., a modified methacrylic copolymer). Other binders that can be used in the present TCF are disclosed in International (PCT) Patent Application Publication No. WO 2016/172315, the entire disclosure of which is incorporated herein by reference for all purposes. The printed CNT layer was dried with a hand-held convection dryer set to 177° C. exit air temperature for ~30 seconds and then baked in a convection oven for 5 minutes at 105° C. The sample was allowed to cool to ambient temperature (~25° C.). Using a wash bottle, the sample was then sprayed with a 10% ferric nitrate ($Fe(NO_3)_3$) in water solution for 30 seconds. Using a separate wash bottle, the sample was then sprayed with deionized water on both sides of the film for 30 seconds. The film was then patted dry with lint free cloths to remove large water droplets and then baked in a convection oven for 1 minute at 105° C. The CNT layer of this example was printed and etched with two different ratios of binder:CNT (120:1, 240:1).

After screen-printing the CNT ink and etching, the % VLT and Rs were 32.2% (subtracting the substrate VLT) and 1 Ω/□ respectively in all cases in the 2.5" CNT print area. After etching, the exposed area outside of the 2.5" CNT print area, the % VLT increased to 90.0% (subtracting the substrate) and the sheet resistance was not measurable.

Results are summarized in Table 3 below:

TABLE 3

TCF Performance of <1 OPS AgNW Version

| Description | Rs, (Ω/□) | VLT[1], (%) | Haze, (%) |
|---|---|---|---|
| Substrate (5 mil PET-ST505) | ∞ | 90.0 | 1.1 |
| AgNW Coating | 1 | 45.6 | 36.9 |
| CNT Printed AgNW Coating | 1 | 32.2 | 42.9 |
| Post Etch (Within 2.5" CNT Print Area) | 1 | 32.2 | 42.9 |
| Post Etch (Outside 2.5" CNT Print Area) | ∞ | 90.0 | 1.1 |

[1]The substrate has been subtracted from the VLT measurements.

<1 OPS MM Version: A TCF was prepared using PET (125 um) as the substrate, flexo printed with silver (Ag) ink in a hex pattern (30 micron lines with thickness of about 0.1 to 0.15 micron, 500 micron spacing) at 120 feet per minute using an anilox roll and baked in a convection oven for 5 seconds at 170° C. The hex patterned film was then bath electroplated with copper (Cu). The overlying copper layer had a thickness of about 0.5-1.5 micron (thus about 5-10 times the thickness of the MM layer). The Ag patterned film was screen-printed with a carbon nanotube ink (VC101 single wall CNT ink from Chasm Advanced Materials Inc.) using a 305 polyester mesh screen (~30 um wet-film thickness) having a 2.5 inch block pattern. The ink was reformulated to a CNT concentration of 0.1 g/L and included the binder described above. The CNT layer of this example was printed and etched with two different ratios of binder:CNT (120:1, 240:1). The printed CNT layer was dried with a hand-held convection dryer set to 177° C. exit air temperature for ~30 seconds and then baked in a convection oven for 5 minutes at 105° C. The sample was allowed to cool to ambient temperature (~25° C.). Using a wash bottle, the sample was then sprayed with a 40% ferric nitrate ($Fe(NO_3)_3$) in water solution for 15 seconds to etch the exposed Ag patterned film. Using a separate wash bottle, the sample was then sprayed with deionized water on both sides of the film for ~30 seconds to remove the etchant. The film was then patted dry with lint free cloths to remove large water droplets and then baked in a convection oven for 1 minute at 105° C.

After flexo printing the Ag hex pattern, the % visible light transmission (% VLT) was 90.6% (subtracting the substrate VLT), and had a sheet resistance (Rs) of 5 Ω/□. After electroplating with Cu, the % VLT was 90.2% (subtracting the substrate), and had a Rs of <1 Ω/□. After screen-printing the 240:1 binder:CNT ink and etching, the % VLT and Rs remained at 90.6% (subtracting the substrate) and <1 Ω/□ respectively in the 2.5" CNT pattern area. In the exposed areas outside the 2.5" CNT pattern area, % VLT and Rs both increased to 99.6% (subtracting the base) and infinity respectively. After screen-printing the 120:1 binder:CNT ink and etching, there was clear evidence of the etchant biting into the 2.5" CNT square area, starting from the outside border and working its way into the center of the 2.5" square. In the exposed area outside the 2.5" CNT square, the % VLT and Rs both increased to 99.6% (subtracting the base) and infinity respectively.

Results are summarized in Table 4 below:

TABLE 4

TCF Performance of <1 OPS MM Version

| Description | Rs, (Ω/□) | VLT[1], (%) | Haze, (%) |
|---|---|---|---|
| Substrate (5 mil PET-ST505) | ∞ | 90.0 | 0.9 |
| Ag Hex Pattern | 5 | 90.6 | 1.3 |
| Cu Plated Ag Hex Pattern | <1 | 90.2 | 1.3 |
| CNT Printed Cu Plated Ag Hex Pattern | <1 | 90.6 | 1.3 |
| Post Etch (Within 2.5" CNT Print Area) | <1 | 90.6 | 1.3 |
| Post Etch (Outside 2.5" CNT Print Area) | ∞ | 99.6 | 0.9 |

[1]The substrate has been subtracted from the VLT measurements.

A comparison of the results for <1 OPS MM vs. AgNW versions using 0.1 g/L 240:1 binder:CNT ink are set forth in Table 5 below:

TABLE 5

TCF Performance of <1 OPS MM vs. AgNW Version

| Description | Rs, (Ω/□) | VLT[1], (%) | Haze, (%) |
|---|---|---|---|
| MM Version | <1 | 90.6 | 1.3 |
| AgNW Version | 1 | 32.2 | 42.9 |

[1]The substrate has been subtracted from the VLT measurements.

MM Flexo Printed Nano Ag+CNT Inks+Etchant/Conditions:

Square Ag MM+CNT vs. etch time: A TCF sample was prepared using PET (125 um) as the substrate, flexo printed with silver (Ag) ink in a square mesh pattern at 120 feet per minute using an anilox roll and baked in a convection oven for 5 seconds at 170° C. The Ag patterned film was screen-printed with a carbon nanotube ink (VC101 single wall CNT ink from Chasm Advanced Materials Inc.) using a 305 polyester mesh screen (~30 um wet-film thickness) having a 2.5 inch block pattern. The ink was reformulated to a CNT concentration of 0.1 g/L and included the binder described above at a 240:1 binder:CNT ratio. The printed CNT layer was dried with a hand-held convection dryer set to 177° C. exit air temperature for ~30 seconds and then baked in a convection oven for 5 minutes at 105° C. The sample was allowed to cool to ambient temperature (~25° C.). The sample was then dipped into a 40% by weight solution of ferric nitrate ($Fe(NO_3)_3$) in deionized (DI) water, then rinsed with deionized water on both sides of the film for ~30 seconds using a wash bottle. The samples were then patted dry with lint free cloths to remove large water droplets and baked in a convection oven for 1 minute at 105° C.

The initial sheet resistance (Rs) and visible light transmittance (% VLT) of the square Ag mesh with CNT printed prior to etching was 88.7% (subtracting the substrate) and 4 Ω/□ respectively. The TCF of this example was dipped into a 40% by weight solution of ferric nitrate ($Fe(NO_3)_3$) in deionized (DI) water for varying etch durations (120, 60, 45, & 10 seconds).

Post etching, the Rs measurements for the 120 and 60 second etch durations increased to 15 and 7 Ω/□ respectively, showing degradation in the patterned TCF film while the % VLT remained the same at 88.7% (subtracting the base). The % VLT and Rs measurements for the 45 and 10 second etch durations remained the same as the initial 88.7% (subtracting the substrate) and 4 Ω/□ respectively.

MM Flexo Printed Nano Ag+Cu Plating+CNT Inks+Ethanol/Conditions:

Cu Plated MM vs. etchant type: A TCF sample was prepared using PET (125 um) as the substrate, flexo printed with silver (Ag) ink in a hex mesh pattern (30 micron lines, 500 micron spaces) at 120 feet per minute using an anilox roll and baked in a convection oven for 5 seconds at 170° C. The hex patterned film was then bath electroplated with copper (Cu) with agitation to a thickness of 1.0 micron. The Ag patterned film was screen-printed with a carbon nanotube ink (VC101 single wall CNT ink from Chasm Advanced Materials Inc.) using a 305 polyester mesh screen (~30 um wet-film thickness) having a 2.5 inch block pattern. The ink was reformulated to a CNT concentration of 0.1 g/L and included the binder described above at a 240:1 binder:CNT ratio. The printed CNT layer was dried with a hand-held convection dryer set to 177° C. exit air temperature for ~30 seconds and then baked in a convection oven for 5 minutes at 105° C. The sample was allowed to cool to ambient temperature (~25° C.) The initial visible light transmittance (% VLT) and sheet resistance (Rs) of the Cu plated Ag mesh with CNT printed prior to etching was 90.6% (subtracting the substrate) and <1 Ω/□, respectively.

The TCF of this example was etched using two different etchant solutions (40% ferric nitrate, 20% ferric chloride) and combinations thereof. The samples were then rinsed with deionized (DI) water on both sides of the film for ~30 seconds using a wash bottle, then patted dry with lint free cloths to remove large water droplets and baked in a convection oven for 1 minute at 105° C.

Sample A was dipped in 40% ferric nitrate for 15 seconds. The % VLT and Rs remained at 90.6% (subtracting the substrate) and <1 Ω/□ respectively in the 2.5" CNT pattern area. In the exposed areas outside the 2.5" CNT pattern area, % VLT and Rs both increased to 99.6% (subtracting the base) and infinity respectively. The outside edge of the 2.5" CNT also had a ~2 mm halo of unetched material.

Sample B was dipped in 20% ferric chloride for 10 seconds. The % VLT and Rs remained at 90.6% (subtracting the substrate) and <1 Ω/□ respectively in the 2.5" CNT pattern area. In the exposed areas outside the 2.5" CNT pattern area, the % VLT increased to 92.9% (subtracting the base), 6.7% lower than Sample A meaning that the exposed mesh area was not being completely removed even though the Rs was infinity. The ferric chloride cleaned up the halo effect seen in sample A.

Sample C was first dipped in 40% ferric nitrate for 15 seconds, rinsed and dried as described above, then dipped into 20% ferric chloride for 10 seconds, and finally rinsed and dried again as described above. The % VLT and Rs remained at 90.6% (subtracting the substrate) and <1 Ω/□ respectively in the 2.5" CNT pattern area. In the exposed areas outside the 2.5" CNT pattern area, % VLT and Rs both increased to 99.6% (subtracting the base) and infinity respectively. The post ferric chloride cleaned up the halo effect seen after the initial ferric nitrate etch.

Sample D was first dipped in 20% ferric chloride for 10 seconds, rinsed and dried as described above, then dipped into 40% ferric nitrate for 15 seconds, and finally rinsed and dried again as described above. The % VLT and Rs remained at 90.6% (subtracting the substrate) and <1 Ω/□ respectively in the 2.5" CNT pattern area. In the exposed areas outside the 2.5" CNT pattern area, the % VLT increased to 96.0% (subtracting the base), 3.6% lower than Sample A meaning that the exposed mesh area was not being completely removed even though the Rs was infinity. The ferric chloride cleaned up the halo effect seen in sample A.

Cu plated MM vs. etchant application method: A TCF was prepared using PET (125 um) as the substrate, flexo printed with silver (Ag) ink in a hex pattern (30 micron lines, 500 micron spacing) at 120 feet per minute using an anilox roll and baked in a convection oven for 5 seconds at 170° C. The hex patterned film was then bath electroplated with copper (Cu) with agitation to a thickness of 1.0 micron. The Ag patterned film was screen-printed with a carbon nanotube ink (VC101 single wall CNT ink from Chasm Advanced Materials Inc.) using a 305 polyester mesh screen (~30 um wet-film thickness) having a 2.5 inch block pattern. The ink was reformulated to a CNT concentration of 0.1 g/L and included the binder described above at a binder:CNT ratio of 240:1. The printed CNT layer was dried with a hand-held convection dryer set to 177° C. exit air temperature for ~30 seconds and then baked in a convection oven for 5 minutes at 105° C. The sample was allowed to cool to ambient temperature (~25° C.). The initial % VLT and sheet resistance (Rs) of the CNT printed Cu plated Ag mesh with CNT printed prior to etching was 90.6% (subtracting the substrate) and <1 Ω/□ respectively.

The TCF of this example was etched using two different application methods (spray, dip) with 40% ferric nitrate ($Fe(NO_3)_3$) in water solution for 15 seconds. Using a separate wash bottle, the samples were then sprayed with deionized water on both sides of the film for ~30 seconds. The film was then patted dry with lint free cloths to remove large water droplets and then baked in a convection oven for 1 minute at 105° C. In both cases, the % VLT and Rs in the 2.5" CNT square area remained unchanged at 90.6% (subtracting the substrate) and <1 Ω/□ respectively. Both samples showed good etching of the exposed Cu plated mesh pattern that were not protected by the 2.5" CNT square, but the dipped sample showed a ~2 mm halo around the 2.5" printed square that was not fully etched. The sprayed ferric nitrate did not show any signs of this halo.

Chemical Etching of AgNWs Version of AgeNT:

Etching of AgeNT-75: A TCF was prepared using PET (125 um) as the substrate, coated with a dispersion of 0.3% by weight silver nanowire solution using aqueous silver nanowire ink (~40 nm diameter; 15 um length). The AgNW coating was ~5 inches wide×7 inches long. The AgNW dispersion was coated onto the PET film using a Mayer rod (12 micron wet-film-thickness) at 28 mg/m2 AgNW coverage. The coating was dried with a hand-held convection dryer set to 177° C. exit air temperature for ~30 seconds and then baked in a convection oven for 3 minutes at 105° C. The AgNW coating was screen-printed with a carbon nanotube ink (VC101 single wall CNT ink from Chasm Advanced Materials Inc.) using a 305 polyester mesh screen (~30 um wet-film thickness) having a 2.5 inch block pattern. The ink was reformulated to a CNT concentration of 0.1 g/L and included the binder described above at a binder:CNT ratio of 120:1. The printed CNT layer was dried with a hand-held convection dryer set to 177° C. exit air temperature for ~30 seconds and then baked in a convection oven for 5 minutes at 105° C. The sample was allowed to cool to ambient temperature (~25° C.) The initial % VLT and sheet resistance (Rs) of the CNT printed AgNW film prior to etching was 99.3% (subtracting the substrate) and 60 Ω/☐ respectively.

The TCF in this example was sprayed with a 10% ferric nitrate ($Fe(NO_3)_3$) in water solution for 15 seconds. Using a separate wash bottle, the sample was then sprayed with DI water on both sides of the film for 30 seconds. The film was then patted dry with lint free cloths to remove large water droplets and then baked in a convection oven for 1 minute at 105° C.

After screen-printing the CNT ink and etching, the % VLT and Rs remained 99.3% (subtracting the substrate VLT) and 60 Ω/☐ respectively in all cases in the 2.5" CNT print area. After etching, the exposed area outside of the 2.5" CNT print area, the % VLT increased to 91.0% (same value as bare substrate) and the sheet resistance was not measurable.

Following are summaries of various chemical etchants that can be used to etch copper (Cu) or silver (Ag) materials. To date, the best mode for etching AgNW or MM has been using ferric nitrate as the etchant and using a spraying method vs. dipping. This does not exclude other etchants or other etching methods, now known or developed in the future.

Review of Cu and Ag Etching Technology:

Copper Etchants: Many wet chemical systems (Table 6) have been used to etch Cu. Parameters that may be important for control and optimization of the of the etching process are pH, temperature, etchant replenishment, and the degree of agitation.

One of the most commonly used and least expensive chemical systems is ferric chloride. The mechanism involves oxidizing copper to cuprous chloride. Other chemical species such as HCl are sometimes added to improve etching performance, likely by enhancing the kinetics of cuprous chloride formation which can be a rate controlling step in the overall kinetics of the etching process.

Another commonly used etchant is cupric chloride. Copper is reduced to cuprous chloride, which in turn retards the performance of etchant, so regeneration of the $CuCl_2$ is important. As in the case of ferric chloride, other chemicals (HCl, KCl, NaCl) are typically added to improve performance.

TABLE 6

Commonly Used Etchants for Copper.

| Etchant | Chemical Formula | Ratio |
| --- | --- | --- |
| Ferric Chloride | $FeCl_3$ | 30% |
| Cupric Chloride | $CuCl_2$ | |
| Alkaline etchants | $NH_4OH$ | |
| Hydrogen peroxide-Sulfuric acid | $H_2O_2$—$H_2SO_4$ | |
| Chromic acid-Sulfuric acid | $CrO_3$—$H_2SO_4$ | |
| Sodium Chlorate | $NaClO_3$ | |
| Citric acid | | |
| Ammonium persulfate | $(NH_4)_2S_2O_8$ | |
| Potassium Cyanide | KCN | 20% |
| Nitric acid-water | $H_2O$—$HNO_3$ | 1:5 |
| Nitric acid-hydrogen peroxide | $HNO_3$—$H_2O_2$ | 1:20 |
| Ammonium hydroxide-hydrogen peroxide | $NH_4OH$—$H_2O_2$ | 1:1 |
| Ammonia-hydrogen peroxide | $NH_3$—$H_2O_2$ | 4:1 |
| Phosphoric acid-nitric acid-acetic acid | $H_3PO_4$—$HNO_3$—HAc | 1:1:1 |
| Chromic acid-Sulfuric acid-Nitric acid-Ammonium chloride-water | $HNO_3$—$H_2SO_4$—$CrO_3$—$NH_4Cl$—$H_2O$ | 5 ml-5 ml 4 g-1:90 ml |
| Hydrochloric acid-ferric chloride-water | HCL—$FeCl_3$—$H_2O$ | 4:1:5 |
| Nitric acid-Ferric chloride-water | $HNO_3$—$FeCl_3$—$H_2O$ | 10:5:85 |
| Nitric acid-Ferric Chloride-Bromic acid | $HNO_3$—$FeCl_3$—HBr | 1:1:1 |

Alkaline etchants such as ammonium hydroxide combine with copper ions to form cupric ammonium complex ions which stabilize the dissolved Cu in solution.

While ammonium persulfate is a good etchant for Cu, a heat exchanger is required because the process is exothermic. Further, the etch rate is lower than some of the more aggressive chemical systems, which lends itself to a process that, though it is more easily controlled, may be rate controlling in the overall process scheme.

Silver Etchants: While silver and copper are commonly used in many of the same electrical and electronic applications, the number of etchants that have been used for Ag (Table 7) are far fewer, likely due to the extreme cost differential relative to Cu. Typical etchants for silver include nitric acid-water and sulfuric acid-water systems of varying concentrations.

TABLE 7

Commonly Used Etchants for Silver.

| Etchant | Chemical Formula | Ratio |
| --- | --- | --- |
| Nitric acid-water | $HNO_3$—$H_2O$ | various |
| Sulfuric acid-water | $H_2SO_4$—$H_2O$ | various |
| Potassium Cyanide | KCN—$H_2O$ | 1:10 |
| Ammonium hydroxide-water | $NH_4OH$—$H_2O$ | 1:1 |
| Hydrochloric acid-nitric acid-water | HCL—$HNO_3$—$H_2O$ | 1:1:1 |

TABLE 7-continued

Commonly Used Etchants for Silver.

| Etchant | Chemical Formula | Ratio |
|---|---|---|
| Ammonium hydroxide-hydrogen peroxide | $NH_4OH$—$H_2O_2$ | 15 ml:25 ml |
| Sulfuric acid-Chromium oxide-water | $H_2SO_4$—$Cr_2O_3$—$H_2O$ | 40 g-20 ml-1 liter |
| Ferric nitrate-ethylene glycol-water | $Fe(NO_3)_2$—EG—$H_2O$ | 35 g-100 ml-25 ml |

Additional Examples

There are numerous methods that could be used to create MM layers, with various combinations of Rs and VLT properties. One method involves flexographic printing of the MM using nano Ag inks. This method appears to be suitable for creating MM with Rs approximately 10 OPS and VLT approximately 90%. To reduce the Rs of the MM without compromising the VLT, Cu has been electroplated on top of the printed Ag MM, creating a Ag/Cu MM. Other materials could be used both for the printed layer and the overlying plated layer.

Other methods can be used to create the MM. This includes using more advance flexo printing plates to achieve MM line widths down to approximately 3 microns. Present examples have MM line widths of approximately 30 microns. Reducing MM line width can make the MM much less visible at the same VLT value. Also, a narrower line can enable finer line widths for the CNT hybrid circuits. A general rule of thumb is that the width of the open area of the mesh needs to be approximately 15-20× the MM line width for the % open area of the MM to be higher than about 90%. The % open area determines the maximum VLT value for the printed CNT hybrid circuit. Thus, a 30 micron MM line width needs to have a width in the open area of about 500 microns. Another general rule of thumb is that the minimum printed CNT hybrid circuit line width should be no smaller than 10× the width of the open area segment of the MM in order to have enough conductive material in the circuit line. Thus, the minimum line width for the circuit must be greater than about 5 mm. This minimum line width is expected to be as small as 0.5 mm if the MM line width can be reduced to 3 microns.

It should also be possible to create the MM by printing an appropriate catalyst (e.g., palladium) and using electroless Cu to create the MM. Metals other than Cu may be possible. If Rs is not low enough, then Cu electroplating can be used after electroless Cu deposition.

The MM can also be created using lithographic etching methods or various lift-off patterning methods deployed in the printed circuits industry. Laser ablation of a thin metal film can also be used to create the MM.

FIGS. 4A-4C, 5A and 5B include images describing the printed CNT hybrid (MM version), where the MM was flexo printed Ag (without subsequent Cu electroplating). The SEM image of FIG. 4A (50× magnification) shows a MM hexagonal pattern with Ag line width approximately 30 μm and width across the open spaces of the hexagons of about 500 μm. The SEM image of FIG. 4B (50 k× magnification) shows how the CNTs form a well-connected network in the spaces that would normally have no conductive material. The CNT network has low enough areal density (about 1 to 10 mg/m²) to be transparent, but high enough areal density to allow for charge spreading in the open spaces, which leads to a more uniform electrode. The SEM image of FIG. 4C (100 k× magnification) shows how the CNT network can help strengthen the porous Ag MM lines and also provide redundant conductive pathways to enhance reliability. Note that the CNT inks that were printed on top of the Ag MM shown in FIG. 4A did not have polymer binder in them, only so that the CNT network could be visible in the SEM images of FIGS. 4B and 4C. Normally, the polymer binder is at a high enough level to encapsulate the MM and the CNTs, with the CNT network self-assembling within the polymer matrix. This makes it impossible to see the CNT network in SEM imaging.

Also note that the CNT network within the polymer matrix also provides electrical connectivity from the surface of the printed CNT hybrid circuit all the way down to the underlying MM. This helps to make reliable and easy electrical connections to the circuits. This situation also happens when the CNT inks are printed on top of AgNW. In both cases, there is good electrical connectivity from the surface of the circuits to the underlying MM or AgNW layers.

Figures 5A, 5B:
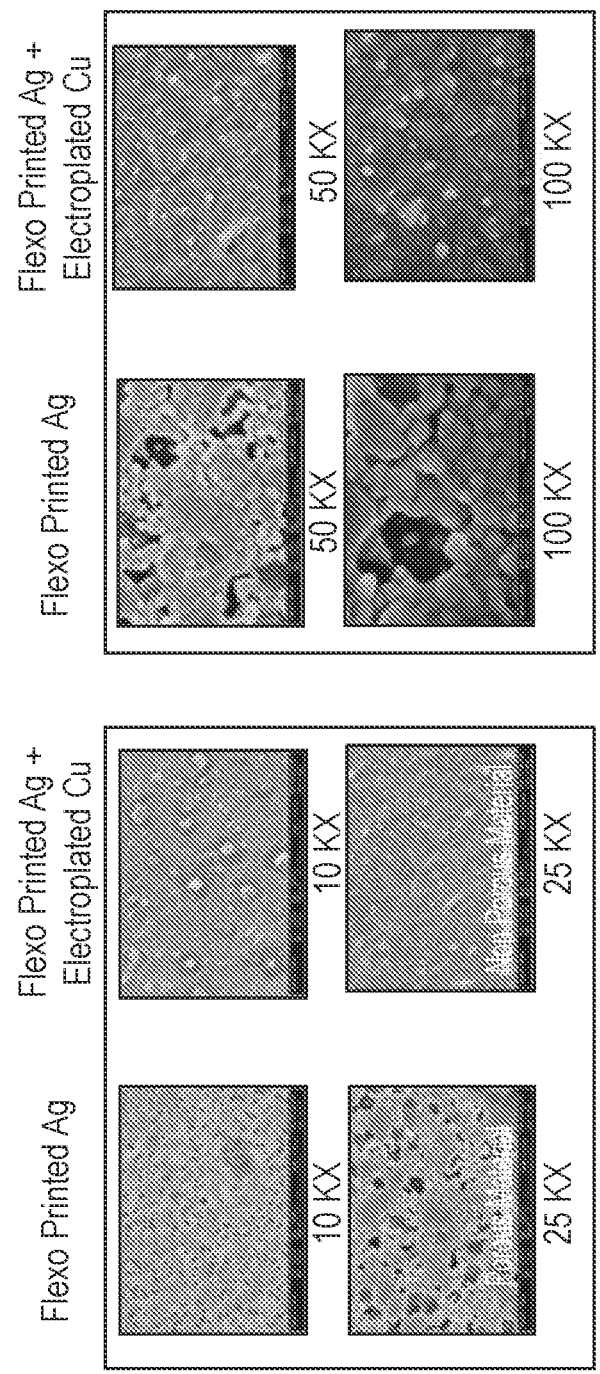
FIGS. 5A and 5B illustrate effects of copper plating of the metal mesh of a TCF.

FIGS. 5A and 5B illustrate flexo printed Ag MM alone, and this MM plated with copper. FIG. 5A includes images of both at 10 k× and 25 k× magnification, while FIG. 5B includes images of both at 50 k× and 100 k× magnification. Also note that the porous appearance of the flexo printed Ag MM can be "filled in" after Cu electroplating to decrease the porosity. The thickness of the Cu electroplating can be approximately 0.5 to 1.5 microns, whereas the thickness of the flexo printed Ag can be approximately 0.1 to 0.15 micron. The SEM images of FIGS. 5A and 5B clearly illustrate this. Not only does sheet resistance decrease with Cu plating (without compromise of VLT), but it is also believed that reliability is improved, due to lower porosity of the Ag/Cu MM structure vs. Ag MM structure alone.

The polymer binder plays a role in enhancing environmental stability and adhesion of the printed CNT hybrid circuit. It also plays a role in protecting the MM or the AgNW from being chemically etched (i.e., it is a component for providing the etch mask functionality). The binder should have good environmental stability and adhesion properties, and should be highly transparent with low haze.

It is reasonable to expect that many different binders could be used. Selection criteria for suitable polymer binder candidates include:
  Good optical properties (high transparency, low haze, low color, refractive index similar to PET)
  Good adhesion to commonly used plastic film substrates (PET, PC, Acrylic, etc.)
  Temperature processing requirements compatible with the plastic film substrates (<120 C)
  Solubility compatible with the ink formulations (e.g., good solubility in alcohol and/or amine components).
  Chemical resistance to common etchants used for Ag and Cu.

The CNT type used in this disclosure was single-wall CNT. However, it is reasonable to expect that good results could also be achieved by substituting double-wall or few-wall or multi-wall CNT.

A number of implementations have been described. Nevertheless, it will be understood that additional modifications may be made without departing from the scope of the inventive concepts described herein, and, accordingly, other examples are within the scope of the following claims.

What is claimed is:

1. A transparent conductive film (TCF), comprising:
a substrate having a surface;
a metal mesh layer over at least a portion of the surface of the substrate;
a conductive layer over the metal mesh layer, the conductive layer comprising carbon nanotubes (CNT) and a binder; and
a second metal layer between the metal mesh layer and the conductive layer.

2. The TCF of claim 1, wherein the second metal layer comprises a copper layer.

3. The TCF of claim 2, wherein the copper layer is electroplated on the metal mesh layer.

4. The TCF of claim 1, wherein the TCF has a sheet resistance of no more than 1 Ohm per square (OPS).

5. The TCF of claim 1, wherein the metal mesh layer and the conductive layer in combination have a visible light transmittance (VLT) of at least 85%.

6. The TCF of claim 5, wherein the metal mesh layer and the conductive layer in combination have a VLT of at least 90%.

7. The TCF of claim 1, wherein the metal mesh layer comprises a network of interconnected metal traces with open spaces between the traces.

8. The TCF of claim 7, wherein the network is in a hexagonal, rectangular or random pattern.

9. The TCF of claim 7, wherein the metal mesh layer comprises at least 90% open spaces.

10. The TCF of claim 7, wherein the metal traces have a line width of no more than 30 microns.

11. The TCF of claim 7, wherein the open spaces of the metal mesh layer have a width that is at least fifteen times the width of the metal traces.

12. The TCF of claim 7, defining a circuit with conductive lines having a width, wherein the conductive line width is at least ten times the width of the metal mesh open spaces.

13. The TCF of claim 1, wherein the metal mesh comprises two different metals, a second metal on top of a first metal.

14. The TCF of claim 13, wherein the first metal comprises silver and the second metal comprises copper.

15. The TCF of claim 1, wherein the CNT in the conductive layer comprises a network with an areal density of about 1-10 mg/m2.

16. The TCF of claim 1, wherein a ratio of binder:CNT in the conductive layer is greater than 120:1.

17. A method of producing a transparent conductive film (TCF), comprising:
providing a substrate having a surface;
depositing a metal mesh layer or a nanowire layer over at least a portion of the surface of the substrate;
depositing a second metal layer on at least some of the metal mesh layer or the nanowire layer; and
patterning a conductive layer over at least some of the second metal layer, the conductive layer comprising carbon nanotubes (CNT) and a binder.

18. The method of claim 17, wherein the nanowire layer comprises silver nanowires.

19. The method of claim 17, further comprising etching exposed metal mesh layer or nanowire layer that is not covered by the conductive layer.

20. The method of claim 19, wherein etching is accomplished by spraying an etchant onto the TCF.

21. The method of claim 20, wherein the etchant comprises ferric nitrate.

22. A transparent conductive film (TCF), comprising:
a substrate having a surface;
a metal mesh layer over at least a portion of the surface of the substrate, wherein the metal mesh comprises two different metals, a second metal on top of a first metal; and
a conductive layer over the metal mesh layer, the conductive layer comprising carbon nanotubes (CNT) and a binder.

23. A transparent conductive film (TCF), comprising:
a substrate having a surface;
a metal mesh layer over at least a portion of the surface of the substrate; and
a conductive layer over the metal mesh layer, the conductive layer comprising carbon nanotubes (CNT) and a binder, wherein a ratio of binder:CNT in the conductive layer is greater than 120:1.

* * * * *